United States Patent
Kashiwakura

(10) Patent No.: US 10,250,215 B2
(45) Date of Patent: Apr. 2, 2019

(54) ELECTRONIC CIRCUIT AND METHOD FOR MOUNTING ELECTRONIC CIRCUIT

(71) Applicant: NEC Corporation, Minato-ku, Tokyo (JP)

(72) Inventor: Kazuhiro Kashiwakura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/523,744

(22) PCT Filed: Dec. 8, 2015

(86) PCT No.: PCT/JP2015/006116
§ 371 (c)(1),
(2) Date: May 2, 2017

(87) PCT Pub. No.: WO2016/092833
PCT Pub. Date: Jun. 16, 2016

(65) Prior Publication Data
US 2017/0323729 A1 Nov. 9, 2017

(30) Foreign Application Priority Data
Dec. 10, 2014 (JP) .................. 2014-249930

(51) Int. Cl.
| | | |
|---|---|---|
| H03H 7/06 | (2006.01) | |
| H03H 1/00 | (2006.01) | |
| H05K 1/02 | (2006.01) | |
| H01G 4/40 | (2006.01) | |
| H01G 4/228 | (2006.01) | |
| H01G 4/38 | (2006.01) | |
| H01G 17/00 | (2006.01) | |

(52) U.S. Cl.
CPC .............. *H03H 7/06* (2013.01); *H01G 4/228* (2013.01); *H01G 4/38* (2013.01); *H01G 4/40* (2013.01);
(Continued)

(58) Field of Classification Search
CPC .......... H01G 17/00; H01G 4/228; H01G 4/38; H01G 4/40; H03H 7/06; H03H 1/0007;
(Continued)

(56) References Cited

U.S. PATENT DOCUMENTS

| 5,844,762 A | 12/1998 | Yamamura et al. | |
|---|---|---|---|
| 2010/0039099 A1* | 2/2010 | Kim .................. | H03H 1/0007 324/120 |

FOREIGN PATENT DOCUMENTS

| JP | H06-132668 A | 5/1994 |
|---|---|---|
| JP | 2001-015885 A | 1/2001 |

(Continued)

OTHER PUBLICATIONS

Machine English Translation of JP2007-305642A Published on Nov. 22, 2007.*
(Continued)

*Primary Examiner* — Rakesh B Patel
*Assistant Examiner* — Jorge L Salazar, Jr.

(57) ABSTRACT

There has been a problem of generating anti-resonance between a three-terminal capacitor and a capacitor when the three-terminal capacitor and the capacitor are mounted. In order to solve the problem, this electronic circuit includes: a capacitor and a three-terminal capacitor, which are connected to a power supply terminal of a circuit component, and a power supply, and which are connected in parallel to each other between the power supply and ground; and a resistor that is connected in series between the ground and a ground terminal of the three-terminal capacitor and/or the capacitor.

8 Claims, 8 Drawing Sheets

(52) U.S. Cl.
CPC .......... *H01G 17/00* (2013.01); *H03H 1/0007* (2013.01); *H05K 1/02* (2013.01); *H05K 1/0231* (2013.01)

(58) Field of Classification Search
CPC .................. H05K 1/02; H05K 1/0231; H05K 2201/10015; H05K 2201/10022; H05K 2201/10689; H05K 2201/10734
USPC .................................................. 333/175, 185
See application file for complete search history.

(56) References Cited

FOREIGN PATENT DOCUMENTS

| | | |
|---|---|---|
| JP | 2003-282347 A | 10/2003 |
| JP | 2006-237234 A | 9/2006 |
| JP | 2007-305642 A | 11/2007 |
| JP | 2007-311567 A | 11/2007 |
| JP | 2008-251571 A | 10/2008 |
| JP | 2012-164816 A | 8/2012 |
| JP | 2012-164817 A | 8/2012 |
| WO | 2012/108122 A1 | 8/2012 |
| WO | 2013/073591 A1 | 5/2013 |

OTHER PUBLICATIONS

Machine English Translation of JP2007-311567A Published on Nov. 29, 2007.*
Japanese Office Action for JP Application No. 2016-563510 dated Mar. 27, 2018 with English Translation.
International Search Report for PCT Application No. PCT/JP2015/006116, dated Jan. 19, 2016.
English translation of Written opinion for PCT Application No. PCT/JP2015/006116, dated Jan. 19, 2016.
Japanese Office Action for JP Application No. 2016-563510 dated Oct. 16, 2018 with English Translation.

* cited by examiner

Fig. 5  -- RELATED ART --

ELECTRONIC CIRCUIT AND METHOD FOR MOUNTING ELECTRONIC CIRCUIT

This application is a National Stage Entry of PCT/JP2015/006116 filed on Dec. 8, 2015, which claims priority from Japanese Patent Application 2014-249930 filed on Dec. 10, 2014, the contents of all of which are incorporated herein by reference, in their entirety.

TECHNICAL FIELD

The present invention relates to an electronic circuit, and a method for mounting an electronic circuit.

BACKGROUND ART

Noise reduction in a power supply is an important matter because of increase in signal speed and decrease in a voltage of a power supply. In particular, in a decoupling circuit, an impedance property up to a high-frequency region needs to be taken into consideration, and anti-resonance (parallel resonance) between capacitors and between a power supply line and a capacitor may occur to become a problem in some cases.

PTL 1 discloses a multilayer wiring substrate enabling power supply impedance to be reduced at an anti-resonance frequency. A plurality of decoupling capacitors are connected in parallel to each other between a power supply and ground in the multilayer wiring substrate. The plurality of decoupling capacitors are constituted of a laminated ceramic capacitor connected by a wiring pattern including a resistance pattern having a predetermined resistance value, and a laminated ceramic capacitor connected by a wiring pattern not including a resistance pattern.

PTL 2 discloses a multilayer wiring substrate enabling power supply impedance to be reduced at an anti-resonance frequency. A plurality of decoupling capacitors connected in parallel to each other between a power supply and ground in the multilayer wiring substrate are constituted of a capacitor of high equivalent series resistance (ESR) and a capacitor of low ESR.

PTL 3 discloses a technique in which a capacitor element of high ESR and a capacitor element of low ESR are interposed in parallel and in a polarity inversed manner between a power supply and ground, and on keeping low impedance at a resonance frequency, impedance at an anti-resonance frequency is reduced.

PTL 4 discloses a decoupling circuit reducing internal impedance.

CITATION LIST

Patent Literature

[PTL 1] Japanese Laid-open Patent Publication No. 2012-164816
[PTL 2] Japanese Laid-open Patent Publication No. 2012-164817
[PTL 3] International Publication No. WO 2012/108122
[PTL 4] International Publication No. WO 2013/073591

SUMMARY OF INVENTION

Technical Problem

PTL 1 and PTL 2 concern the technique for a two-terminal decoupling capacitor. In the technique, equivalent series resistance of a wiring pattern is increased using a resistive paste or the like to thereby suppress anti-resonance between a capacitor and a capacitor or between a capacitor and a wiring substrate. However, PTL 1 and PTL 2 do not describe applying the technique to a three-terminal capacitor.

PTL 3 also concerns the technique of suppressing anti-resonance, in which two laminated ceramic capacitor elements are coupled to thereby form one ceramic sintered body. Accordingly, it is not considered that existent capacitors including a three-terminal capacitor are used.

PTL 4 describes impedance reduction in the decoupling circuit. However, PTL 4 does not describe applying the impedance reduction to a circuit including a three-terminal capacitor.

Generally, in a passage type structure (schematically illustrated in FIG. 2 described later) connected to a power supply line or a signal line, a three-terminal capacitor is used, for example, for power supply separator to remove noise. A three-terminal capacitor has small equivalent series resistance (ESR) and equivalent series inductance (ESL), and is advantageous for impedance reduction of a power supply.

However, when both a three-terminal capacitor and a general capacitor (in the following, simply mentioned "a (the) capacitor" indicates a two-terminal capacitor) are mounted, anti-resonance occurs between an inductance property of the three-terminal capacitor and a capacitance property of the capacitor. Since the inductance property shows an upward slope in a graph whose horizontal axis indicates a frequency and the capacitance property shows a downward slope in the same graph, these two properties cause anti-resonance. The caused anti-resonance increases impedance of a power supply, causing unfavorable conditions such as increase in a power supply noise and degradation in electromagnetic interference (EMI).

For this reason, an object of the present invention is to suppress high impedance that is caused by anti-resonance between a three-terminal capacitor and a capacitor, which is the above-described problem.

Solution to Problem

An electronic circuit according to an example aspect of the invention includes:
a capacitor and a three-terminal capacitor that are connected to a power supply terminal of a circuit component and a power supply, and are connected in parallel to each other between the power supply and ground; and
a resistor that is connected in series between the ground and a ground terminal of at least one of the three-terminal capacitor and the capacitor.

A method for mounting an electronic circuit is provided. The method includes:
connecting a capacitor and a three-terminal capacitor to a power supply terminal of a circuit component and a power supply, and connecting the capacitor and the three-terminal capacitor in parallel to each other between the power supply and ground; and
connecting a resistor in series between the ground and a ground terminal of at least one of the three-terminal capacitor and the capacitor.

Advantageous Effects of Invention

According to the present invention, it is possible to suppress high impedance caused by anti-resonance between a three-terminal capacitor and a capacitor.

DESCRIPTION OF EMBODIMENTS

<First Example Embodiment>

A first example embodiment for embodying the present invention is described in detail with reference to the drawings.

Figure 1:
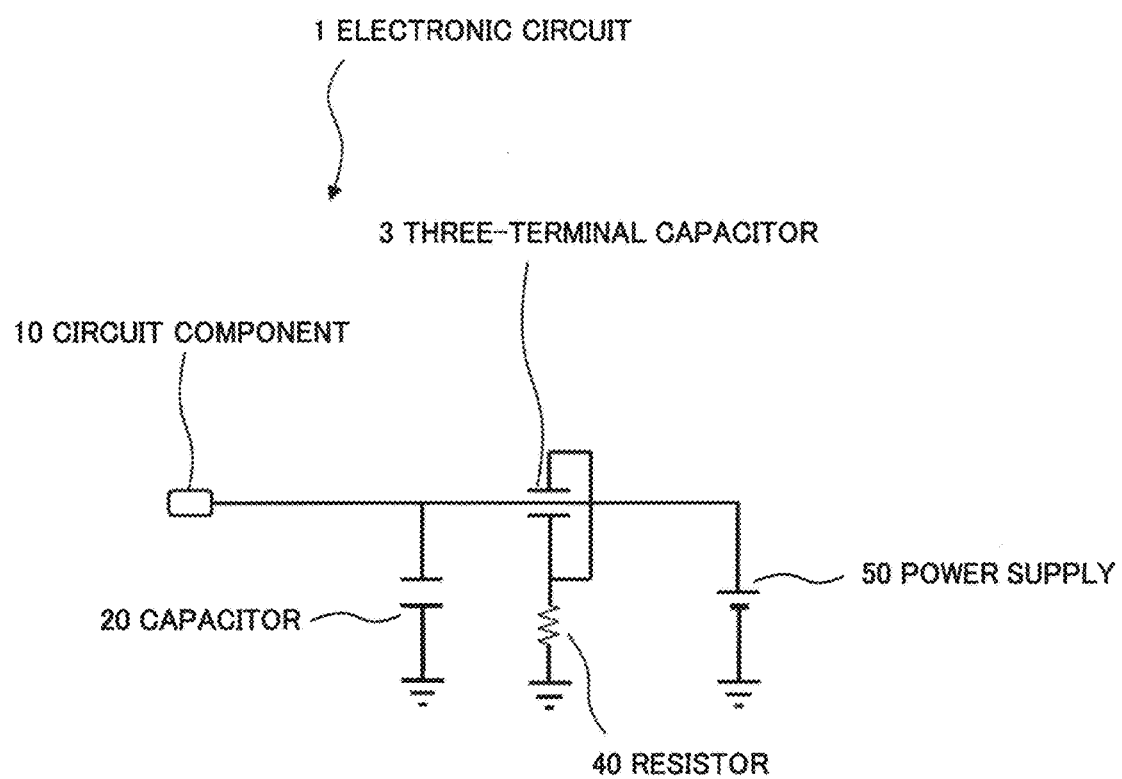
FIG. 1 is a circuit diagram illustrating one example of a configuration of an electronic circuit according to a first example embodiment of the present invention.

FIG. 1 is a circuit diagram illustrating one example of a configuration of an electronic circuit 1 according to the first example embodiment of the present invention.

The electronic circuit 1 is configured to include a circuit component 10, a capacitor 20, a three-terminal capacitor 30, a resistor 40, and a power supply 50. The electronic circuit 1 is a decoupling circuit providing the power supply 50 to the circuit component 10, and suppressing influence of a noise between circuits.

The circuit component 10 is, for example, an integrated circuit (IC), large scale integration (LSI), or the like.

The capacitor 20 is, for example, a laminated ceramic capacitor chip or the like used for decoupling, and is a two-terminal structure including two external output terminals. The number of the capacitors 20 mounted between the circuit component 10 and the three-terminal capacitor 30 is one in the example of FIG. 1, but may be plural.

The three-terminal capacitor 30 is, for example, a three-terminal laminated ceramic capacitor chip. The three-terminal capacitor 30 is described in detail, using FIG. 2 described later. A feature of the present example embodiment lies in that a ground terminal (referred to as a GND terminal in the following) of the three-terminal capacitor 30 is not directly connected to the ground, and is connected to the ground via the resistor 40.

The resistor 40 is a chip of an electric resistive component, for example.

In the electronic circuit 1 in FIG. 1, the three-terminal capacitor 30 is connected to the ground via the resistor 40. However, in the electronic circuit 1, the capacitor 20 may be connected to the ground via the resistor 40. In other words, the resistor 40 may be connected in series between the ground terminal and the ground of at least one, for example the one having larger capacitance, of the three-terminal capacitor 30 and the capacitor 20.

Despite that, the following description is made citing as an example a case where the three-terminal capacitor 30 is connected to the ground via the resistor 40 as illustrated in FIG. 1.

Figure 2:
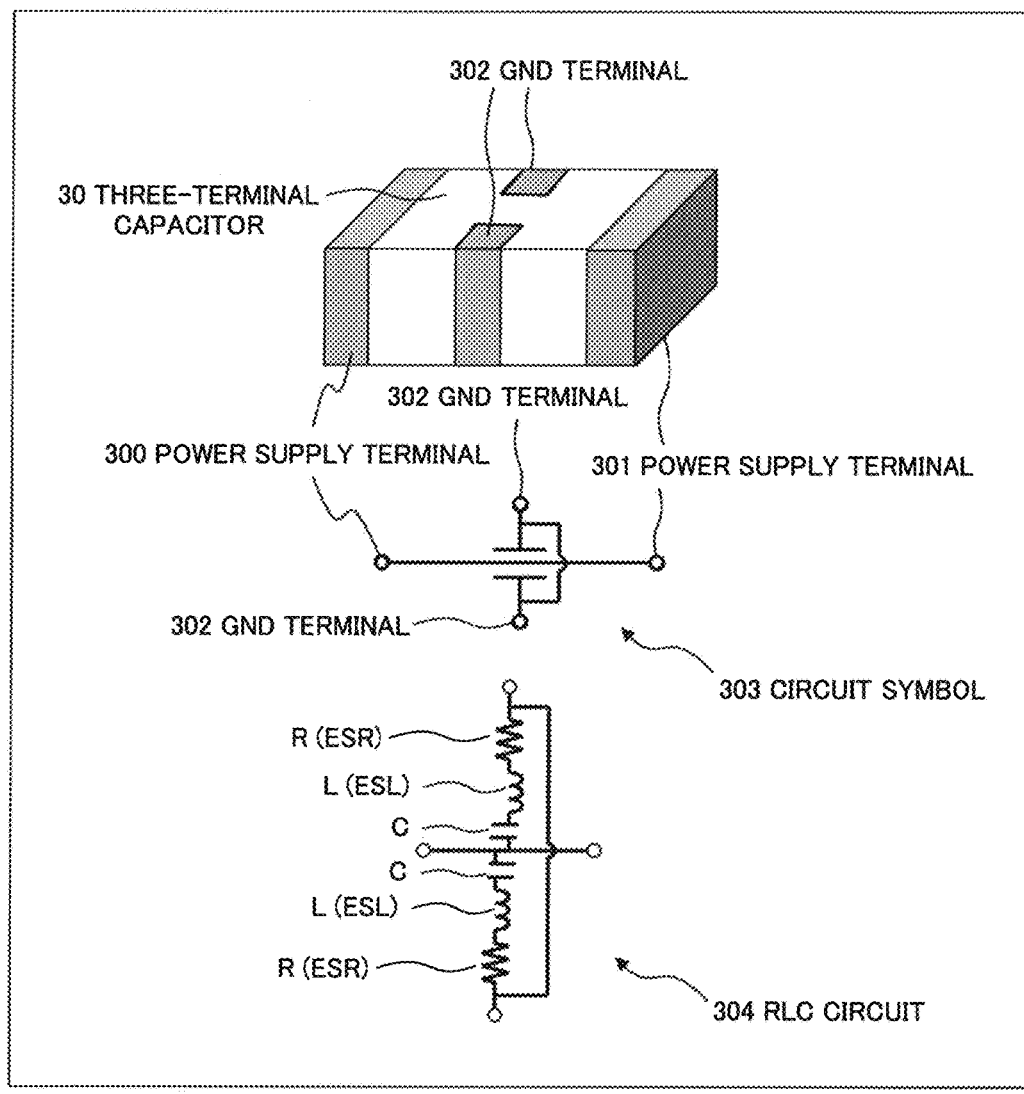
FIG. 2 is a diagram schematically illustrating a structure and an equivalent circuit of a three-terminal capacitor.

FIG. 2 is a diagram schematically illustrating a structure and an equivalent circuit of the three-terminal capacitor 30.

As illustrated in FIG. 2, the three-terminal capacitor 30 is the structure including two power supply terminals 300 and 301, and one or two GND terminals 302. FIG. 2 illustrates a case where the number of the GND terminals 302 is two. Thus, particularly in the case of the chip structure such as FIG. 2, the three-terminal capacitor 30 often includes the external terminals whose total number is four, and this case is cited as one example in the following description. A circuit symbol 303 represents the three-terminal capacitor 30 by using circuit symbols.

A RLC circuit 304 representing the equivalent circuit of the three-terminal capacitor 30 is illustrated on the lower side in FIG. 2. A feature of the three-terminal capacitor 30 lies in that impedance on the ground side is small, and ESL can be reduced.

Figure 3:
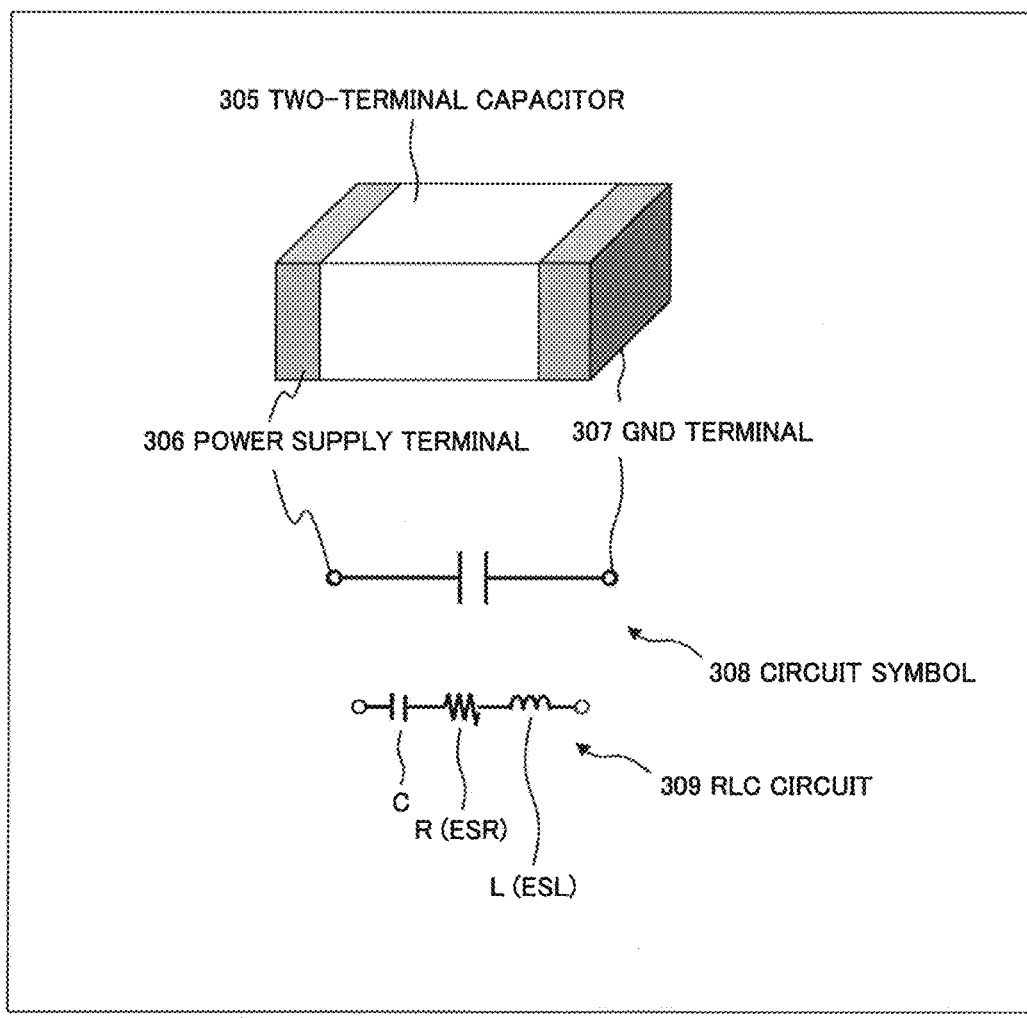
FIG. 3 is a diagram schematically illustrating a structure and an equivalent circuit of a two-terminal capacitor.

Incidentally, before a circuit configuration of the three-terminal capacitor 30 is described, the equivalent circuit of a two-terminal capacitor 305 such as the capacitor 20 or the like is described first, using FIG. 3.

FIG. 3 is a diagram schematically illustrating a structure and an equivalent circuit of the two-terminal capacitor 305.

As illustrated in FIG. 3, the two-terminal capacitor 305 is the structure including a power supply terminal 306 and a GND terminal 307. A circuit symbol 308 represents the two-terminal capacitor 305 by using circuit symbols.

A RLC circuit 309 representing the equivalent circuit of the two-terminal capacitor 305 is illustrated on the lower side in FIG. 3. As illustrated in the drawing, the two-terminal capacitor 305 can be represented by a RLC series circuit. Symbols R (resistance) and L (inductance) in the lower diagram in FIG. 3 indicate physically parasitic resistance and inductance, and are referred to as equivalent series resistance (ESR) and equivalent series inductance (ESL), respectively.

Next, the equivalent circuit of the three-terminal capacitor 30 is represented by the RLC circuit 304 of FIG. 2. As represented by the RLC circuit 309 of FIG. 3, ESR and ESL exist also in the three-terminal capacitor 30. The three-terminal capacitor 30 includes the two GND terminals, and for this reason, has values of R and L smaller than those of a usual two-terminal capacitor. The three-terminal capacitor 30 can be represented by the RLC series circuit in the same manner as in the two-terminal capacitor 305 illustrated in FIG. 3.

Incidentally, assuming that capacitance is C, and equivalent series inductance is L, a capacitor property generally has a boundary at $$\text{resonance frequency } f = 1/\{2\pi\sqrt{(LC)}\}$$

between a low-frequency region where a capacitance property becomes dominant and a high-frequency region where an inductance property becomes dominant.

Generally, when capacitors having different capacitance are connected in parallel, because of a difference in a resonance frequency, a property of this circuit becomes equivalent, at an intersection point of property curves, to that of parallel connection of inductance L of one of the capacitors and capacitance C of the other of the capacitors. The combined impedance is given by $$\text{combined impedance} = j\omega L/(1-\omega 2LC)$$

(where j is an imaginary number, and $\omega = 2\pi f$). Then, at the resonance frequency f, impedance becomes large. This is referred to as anti-resonance.

In order to avoid this anti-resonance, as illustrated in FIG. 1 described above, in the electronic circuit 1, the GND terminal of the three-terminal capacitor 30 is not directly connected to the ground, and is connected to the ground via the resistor 40.

Figure 4:
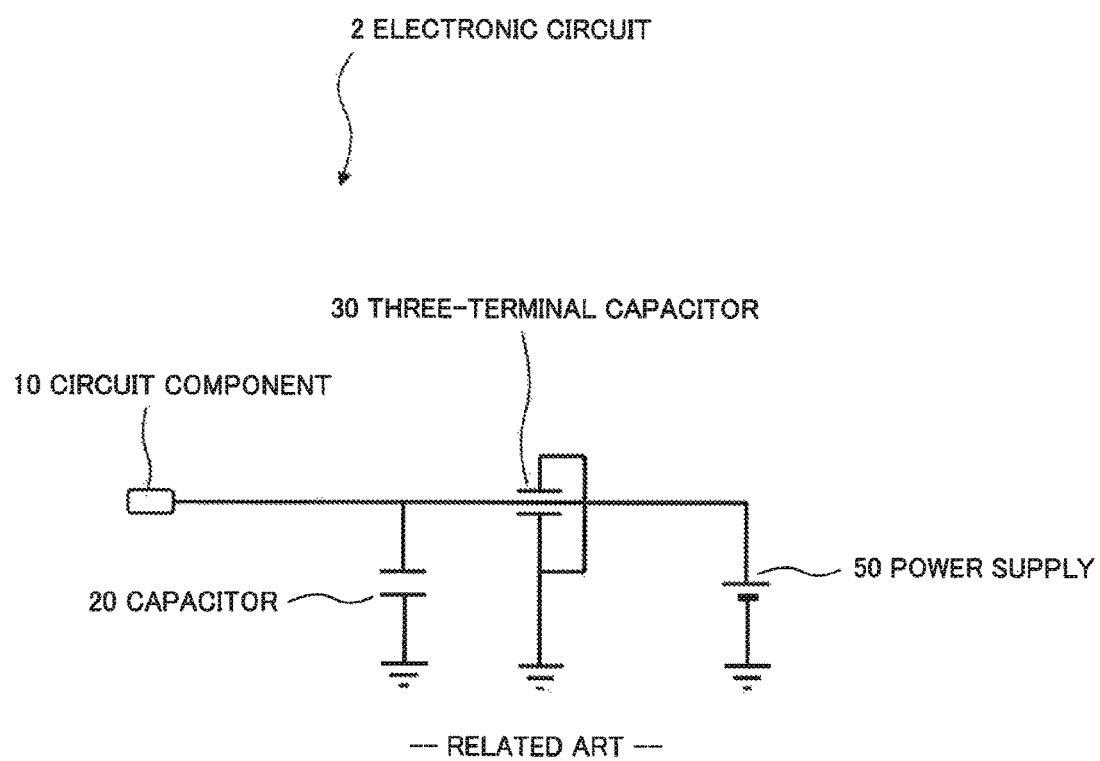
FIG. 4 is a circuit diagram of an electronic circuit in a case of not using a resistor in the electronic circuit of FIG. 1.

FIG. 4 is a circuit diagram of an electronic circuit 2 of a comparison example where the resistor 40 is not used in the electronic circuit 1 of FIG. 1.

The electronic circuit 2 is constituted of the circuit component 10, the capacitor 20, the three-terminal capacitor 30, and the power supply 50.

Figure 5:
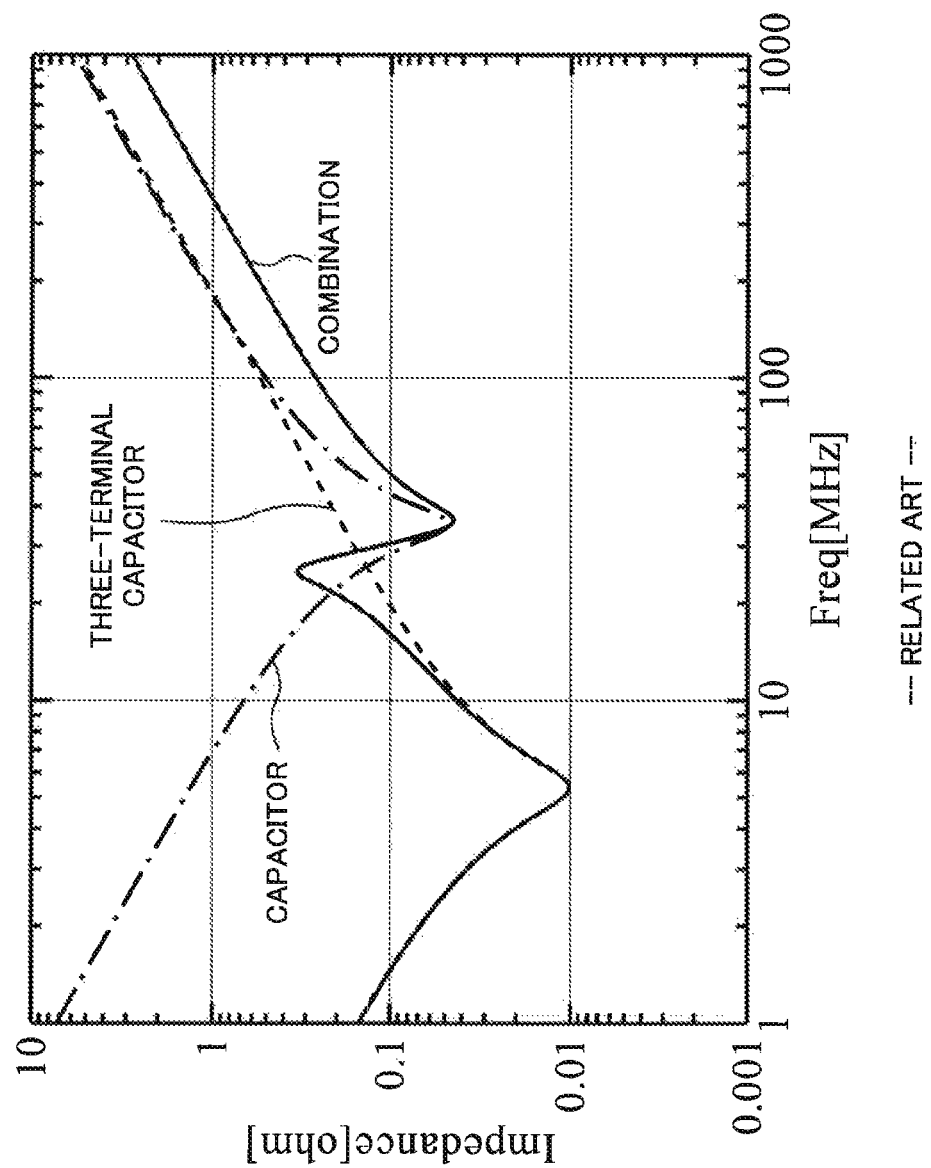
FIG. 5 is a diagram illustrating the impedance properties of the electronic circuit in a case of not using a resistor.

Before a property of the electronic circuit 1 according to the present example embodiment is introduced, a property of the electronic circuit 2 of FIG. 4 is introduced by following FIG. 5.

FIG. 5 is a diagram illustrating the impedance properties of the electronic circuit 2 in the comparison example where the resistor 40 is not used. In FIG. 5, values of impedance of the three-terminal capacitor 30, the capacitor 20, and the circuit where these are combined are indicated in the vertical axis in relation to a frequency in the horizontal axis. Each axis is expressed by a logarithm. In FIG. 5, the one-dotted chain line indicates an impedance property of the capacitor 20. In FIG. 5, the dashed line indicates an impedance property of the three-terminal capacitor 30. The solid line indicates an impedance property of the combined circuit.

FIG. 5 indicates that when the three-terminal capacitor 30 and the capacitor 20 are mounted as illustrated in FIG. 4, impedance of the power supply 50 increases by anti-resonance between an inductance property (an upward slope) of the three-terminal capacitor 30 and a capacitance property (a downward slope) of the capacitor 20. This causes unfavorable conditions such as increase in a power supply noise and degradation in EMI.

Figure 6:
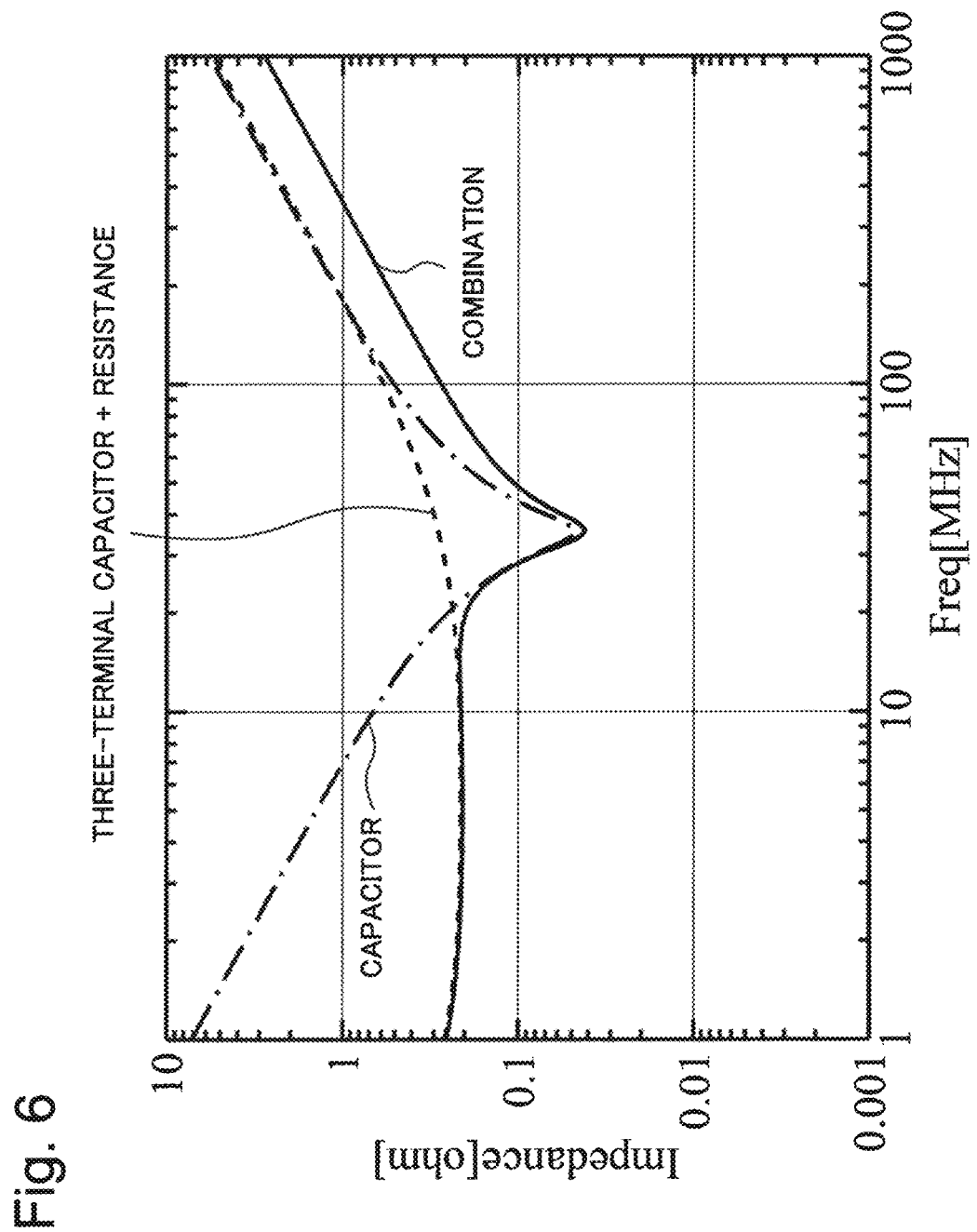
FIG. 6 is a diagram illustrating impedance properties of the electronic circuit illustrated in FIG. 1.

In contrast to this, FIG. 6 is a diagram illustrating impedance properties of the electronic circuit 1 according to the example embodiment of the present invention. FIG. 6 illustrates the properties of the electronic circuit 1 in the same manner as FIG. 5, assuming that capacitance of the three-terminal capacitor 30 is 1 µF, capacitance of the capacitor 20 is 0.01 µF, and a value of the resistor 40 is 200 mΩ.

FIG. 6 indicates that connecting the resistor 40 to the three-terminal capacitor 30 eliminates self-resonance, and causes fluctuation in an impedance value in relation to a frequency to become smaller than in FIG. 5. In other words, it is indicated that in the electronic circuit 1, a resistance property becomes dominant. It is indicated that at an intersection point between a curve (dashed line) of "three-terminal capacitor+resistance property" and a curve (one-dotted chain line) of "capacitance property" in FIG. 6, the electronic circuit 1 is not in LC resonance, and demonstrates behavior of a RC circuit so that increase in impedance disappears.

When the resistor 40 is connected to the capacitor 20, or when the resistor 40 is connected to each of the three-terminal capacitor 30 and the capacitor 20, the same advantageous effect as that of the property illustrated in FIG. 6 can be obtained as well, since the equivalent circuit is equal to that of the case where the resistor 40 is connected to the three-terminal capacitor 30.

Figure 7:
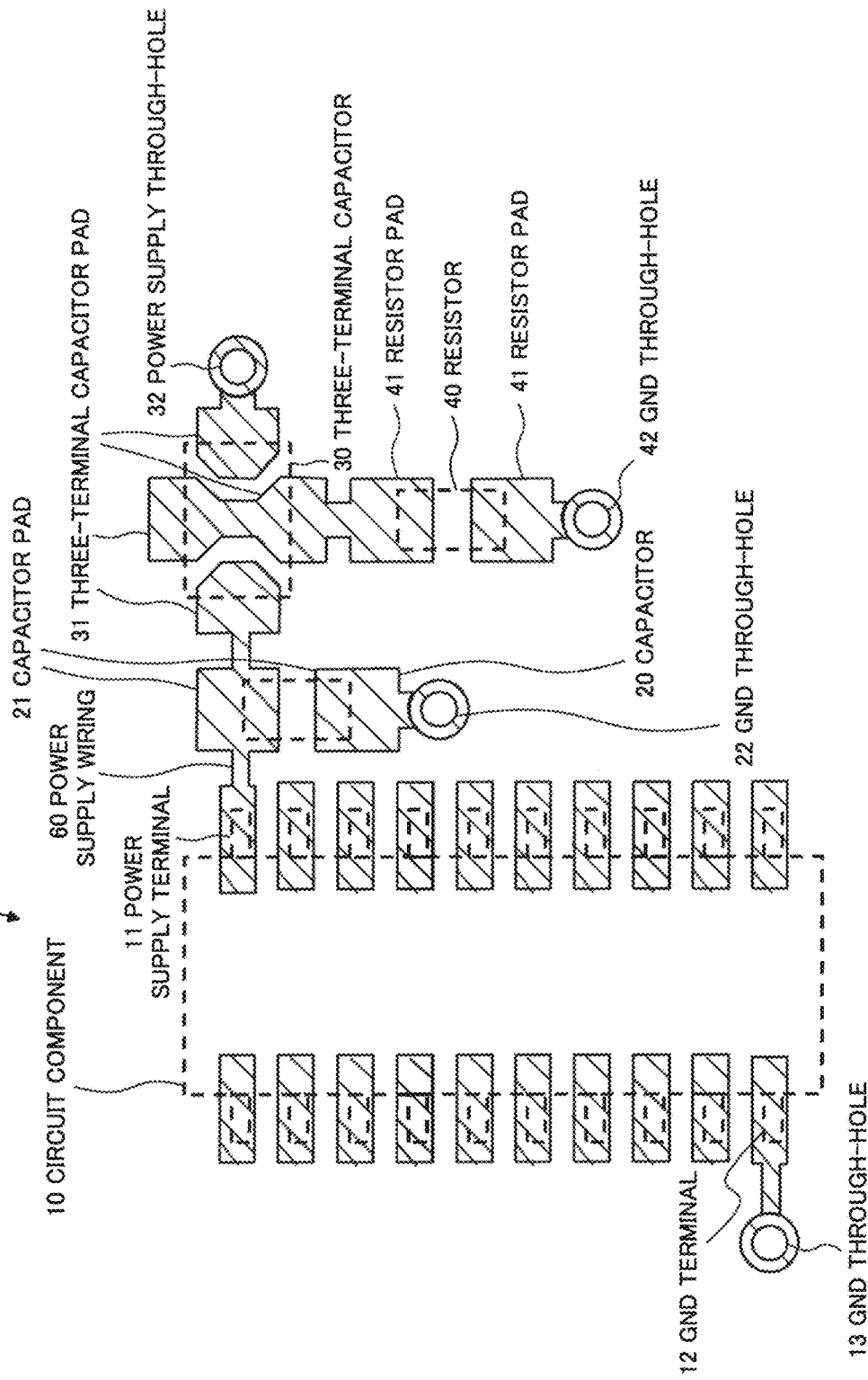
FIG. 7 is a diagram illustrating one example of a printed wiring board.

FIG. 7 is a diagram illustrating one example of a printed wiring board 3 where the electronic circuit 1 is mounted. The illustrated printed wiring board 3 is in a state where the electronic circuit 1 is mounted on a wiring substrate. In FIG. 7, mounted components of the electronic circuit 1 are mounted on the surface side of the printed wiring board 3, and are depicted by the dashed lines. Accordingly, FIG. 7 is also a plan view illustrating a mounted surface of the printed wiring board 3. The hatched portions in FIG. 7 indicate a wiring pattern, and constitute a part of the electronic circuit 1. The printed wiring board 3 indicates a case where one capacitor 20 is mounted. However, the number of the capacitors may be two or more. In this case, it is assumed that the same advantageous effect can be expected as well.

The circuit component 10 is a mounted form such as a small outline package (SOP), for example. The circuit component 10 includes a power supply terminal 11 and a GND terminal 12. The power supply terminal 11 and the GND terminal 12 are connected to a power supply wiring 60 and a GND through-hole 13, respectively.

The capacitor 20 is connected to capacitor pads 21. The capacitor pad 21 on the GND side is connected to the GND through-hole 22.

The three-terminal capacitor 30 is connected to three-terminal capacitor pads 31. The three-terminal capacitor pads 31 on the power supply side are connected to the power supply through-hole 32 and the power supply wiring 60. The three-terminal capacitor pad 31 on the GND side is connected to a resistor pad. 41.

The resistor 40 is connected to the resistor pad 41 and a GND through-hole 42.

The electronic circuit 1 according to the present example embodiment exhibits the advantageous effect as described below.

The advantageous effect is that high impedance caused by anti-resonance between the three-terminal capacitor 30 and the capacitor 20 can be suppressed.

The reason for this is that in the electronic circuit 1, the GND terminal of at least one of the capacitor 20 and the three-terminal capacitor 30 connected in parallel to each other is grounded via the resistor 40 rather than being directly connected to the ground.

<Second Example Embodiment>

Next, a second example embodiment for embodying the present invention is described in detail with reference to the drawings.

Figure 8:
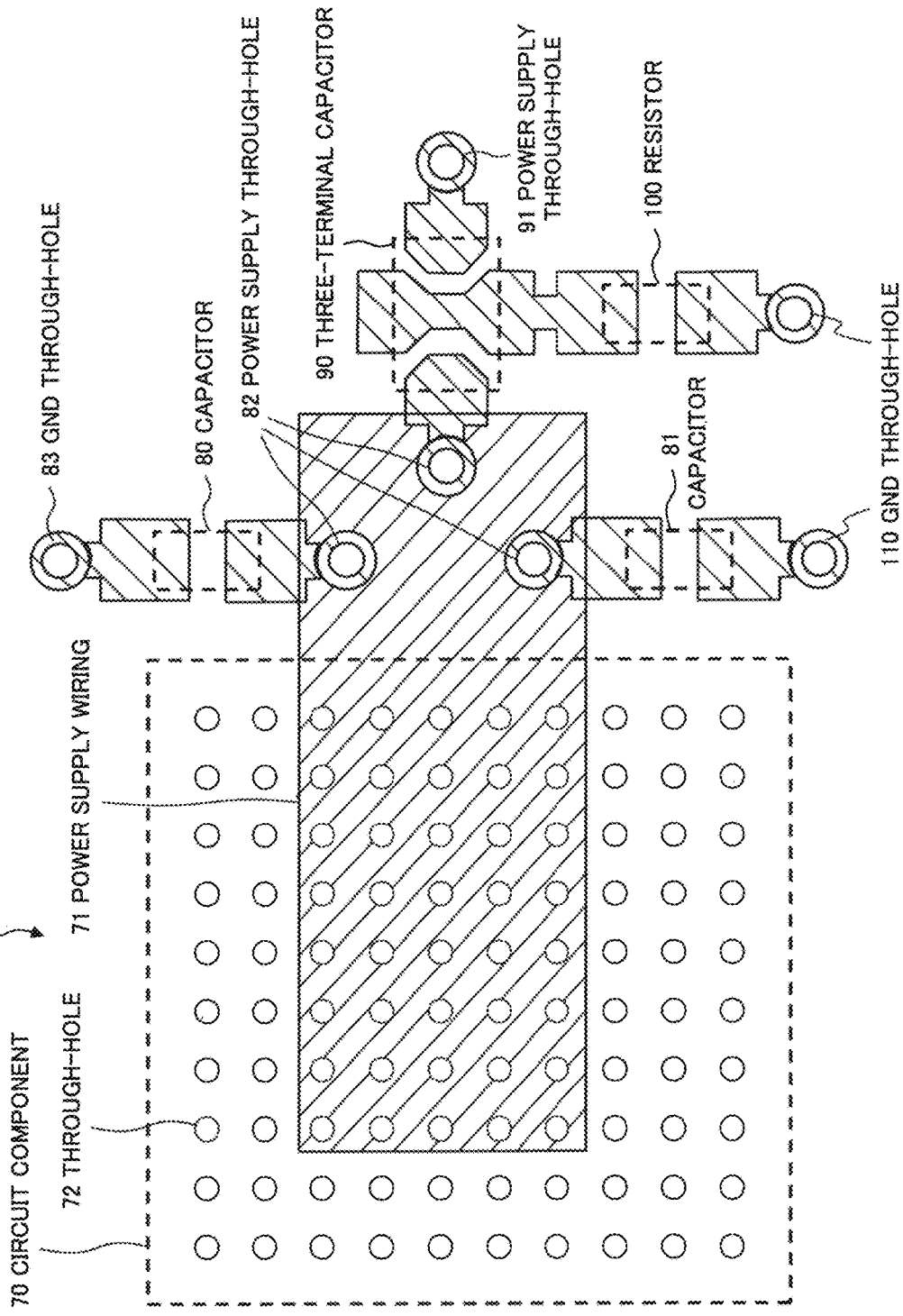
FIG. 8 is a diagram illustrating one example of a printed wiring board according to a second example embodiment.

FIG. 8 is a diagram illustrating one example of a printed wiring board 4 where an electronic circuit according to the second example embodiment is mounted. FIG. 8 is a plan view illustrating a mounted surface of the printed wiring board 4 like the printed wiring board 3 illustrated in FIG. 7. The printed wiring board 4 differs in a wiring configuration of the electronic circuit from the printed wiring board 3 illustrated in FIG. 7, as described below. In the printed wiring board 4, a capacitor 80 and a capacitor 81 connected to a circuit component 70 are mounted. However, the number of the capacitors may be one, or two or more. In this case, it is assumed that the same advantageous effect as in the first example embodiment can be expected as well in the printed wiring board 4.

The circuit component 70 is a mounted form such as a ball grid array (BGA), for example.

A power supply wiring 71 is connected to the circuit component 70 via a plurality of through-holes 72.

The capacitor 80 and the capacitor 81 are connected to the power supply wiring 71 via power supply through-holes 82. The capacitor 80 and the capacitor 81 are connected to a GND through-hole 83 and a GND through-hole 110, respectively.

Power-supply-side pads of a three-terminal capacitor 90 are connected to a power supply through-hole 91 and the power supply through-hole 82. A GND-side pad of the three-terminal capacitor 90 is connected to the GND through-hole 110 via a resistor 100.

Since the rest including connection pads of the resistor 100 and the like is the same as in FIG. 7 of the first example embodiment, the description is omitted.

Incidentally, in FIG. 8, the power supply wiring 71 from the three-terminal capacitor 90 to the circuit component 70 is a wiring layer different from a wiring layer including the pads for mounting the three-terminal capacitor 90, for example. The power supply wiring 71 is connected to the circuit component 70 (such as BGA) via the through-holes for power supply 72.

Thus, in the printed wiring board 4, using the different wiring layers enables a mounting space to be efficiently used.

The printed wiring board 4 according to the present example embodiment exhibits the advantageous effect described below.

The advantageous effect is that, in addition to that the advantageous effect of the above-described first example embodiment can be obtained, efficient use of the mounting space is enabled. The reason for this is that the power supply wiring 71 from the three-terminal capacitor 90 to the circuit component 70 is connected to the circuit component 70 via the through-holes for power supply 72, by using the wiring layer different from the wiring layer including the pads for mounting the three-terminal capacitor 90.

The present invention is described above, citing the above-described example embodiments as model examples. However, the present invention is not limited to the above-described example embodiments. In other words, the present invention can be applied to various modes that can be understood by a person skilled in the art, within a scope of the present invention.

This application claims priority based on Japanese Patent Application No. 2014-249930 filed on Dec. 10, 2014, entire disclosure of which is incorporated herein.

REFERENCE SIGNS LIST

1 Electronic circuit
2 Electronic circuit
3 Printed wiring board
4 Printed wiring board
10 Circuit component
11 Power supply terminal
12 GND terminal
13 GND through-hole
20 Capacitor
21 Capacitor pad
22 GND through-hole
30 Three-terminal capacitor
300 Power supply terminal
301 Power supply terminal
302 GND terminal
303 Circuit symbol
304 RLC circuit
305 Two-terminal capacitor
306 Power supply terminal
307 GND terminal
308 Circuit symbol
309 RLC circuit
31 Three-terminal capacitor pad
32 Power supply through-hole
40 Resistor
41 Resistor pad
42 GND through-hole
50 Power supply
60 Power supply wiring
70 Circuit component
71 Power supply wiring
72 Through-hole
80 Capacitor
81 Capacitor
82 Power supply through-hole
83 GND through-hole
90 Three-terminal capacitor
91 Power supply through-hole
100 Resistor
110 GND through-hole

What is claimed is:

1. An electronic circuit comprising:
   a capacitor and a three-terminal capacitor that are connected to a power supply terminal of a circuit component and a power supply, and are connected in parallel to each other between the power supply and ground; and
   a resistor that is connected in series between the ground and a ground terminal of the three-terminal capacitor and the capacitor.

2. The electronic circuit according to claim 1, wherein, the capacitor is connected to the ground between the circuit component and the three-terminal capacitor.

3. The electronic circuit according to claim 1, wherein the capacitor comprises a plurality of capacitors.

4. The electronic circuit according to claim 1, comprising a wiring layer of a power supply wiring that is mounted in a printed wiring board where the electronic circuit is mounted, and that makes connection to the circuit component from the three-terminal capacitor, wherein the wiring layer is formed on a same wiring surface as a wiring layer where the three-terminal capacitor is mounted.

5. The electronic circuit according to claim 1, comprising a wiring layer of a power supply wiring that is mounted in a printed wiring board where the electronic circuit is mounted, and that makes connection to the circuit component from the three-terminal capacitor, wherein the wiring layer is formed in a layer different from a wiring layer where the three-terminal capacitor is mounted.

6. A method for mounting an electronic circuit, the method comprising:
   connecting a capacitor and a three-terminal capacitor to a power supply terminal of a circuit component and a power supply, and connecting the capacitor and the three-terminal capacitor in parallel to each other between the power supply and ground; and
   connecting a resistor in series between the ground and a ground terminal of the three-terminal capacitor.

7. The method for mounting an electronic circuit according to claim 6, comprising,
   connecting the capacitor to the ground between the circuit component and the three-terminal capacitor.

8. The method for mounting an electronic circuit according to claim 6, wherein the capacitor comprises a plurality of capacitors.

* * * * *